United States Patent [19]

Dahlman

[11] Patent Number: 4,780,681
[45] Date of Patent: Oct. 25, 1988

[54] DIGITAL PHASE LOCKED LOOP USING FIXED FREQUENCY OSCILLATOR AND SIMULATED TIME-SHIFTING

[75] Inventor: Lars Å. Dahlman, Sollentuna, Sweden

[73] Assignee: Telefonaktiebolaget L M Ericsson, Stockholm, Sweden

[21] Appl. No.: 45,856

[22] PCT Filed: Aug. 12, 1986

[86] PCT No.: PCT/SE86/00361
§ 371 Date: Apr. 10, 1987
§ 102(e) Date: Apr. 10, 1987

[87] PCT Pub. No.: WO87/01534
PCT Pub. Date: Mar. 12, 1987

[30] Foreign Application Priority Data

Sep. 6, 1985 [SE] Sweden .................................. 8504152

[51] Int. Cl.⁴ ............................................ H03K 5/159
[52] U.S. Cl. ........................................ 328/55; 307/262
[58] Field of Search .............. 307/262, 602, 603, 606; 328/55, 56

[56] References Cited

U.S. PATENT DOCUMENTS 4,119,796 10/1978 Jones ................................. 328/56 X
4,677,648 6/1987 Zurfluh ............................ 328/56 X Primary Examiner—Eugene R. LaRoche
Assistant Examiner—Steven J. Mottola
Attorney, Agent, or Firm—Burns, Doane, Swecker & Mathis

[57] ABSTRACT

A phase changer includes a simple non-regulatable XO crystal oscillator (25) with a delay circuit (23) connected thereto for providing delays which time is changing linear on the average. A positive or negative, respectively, degree of delay change results in that the circuit sends a signal having a frequency lower or higher, respectively, than the oscillator frequency. The phase changer further includes a calculating unit (24) which compares in time stages a nominal frequency signal with the delay circuit output signal, and which calculates in time stages digital signals for controlling the delay circuit. Due to a relevant comparison result, there are generated the relevant control signals which determine a relevant degree of delay change, resulting in that the output signal comes into phase with the nominal frequency signal.

6 Claims, 3 Drawing Sheets

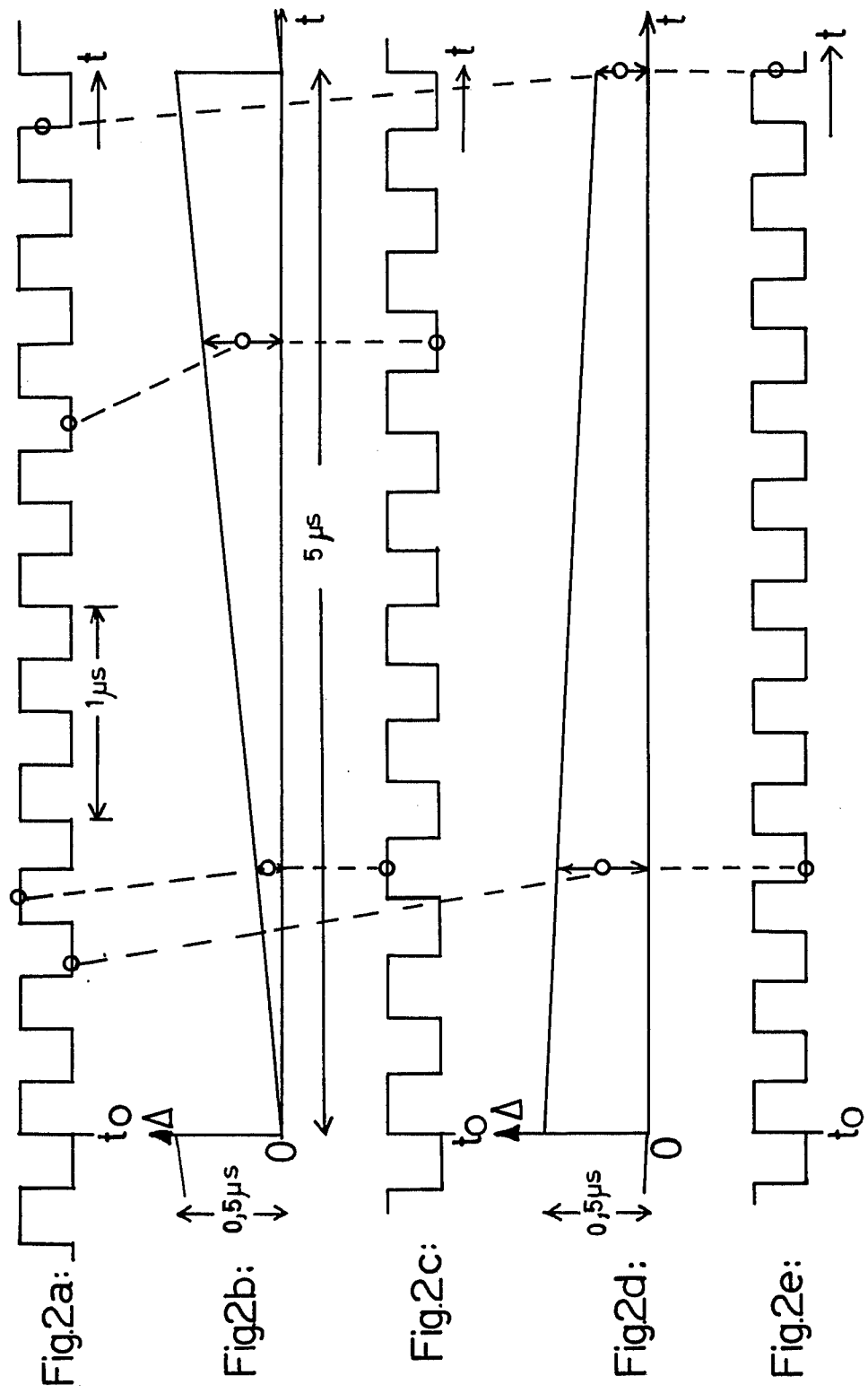

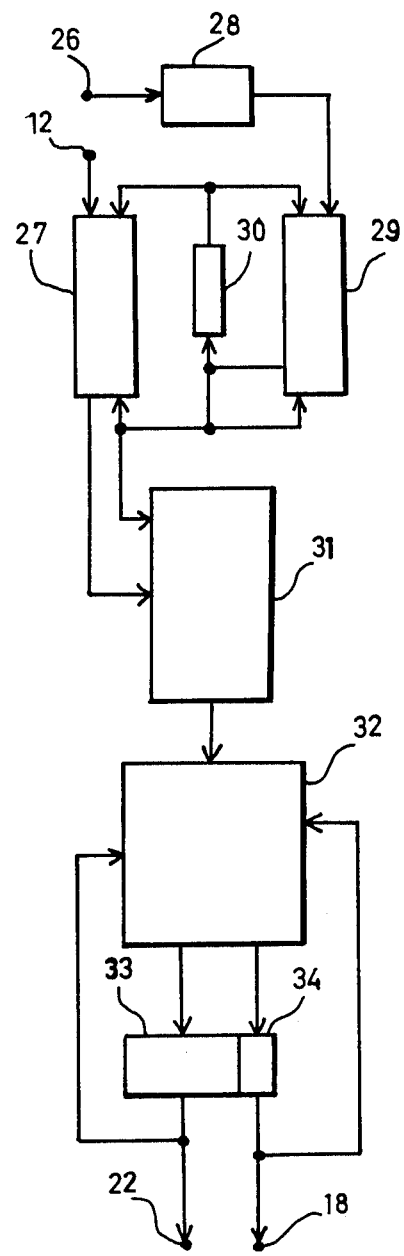
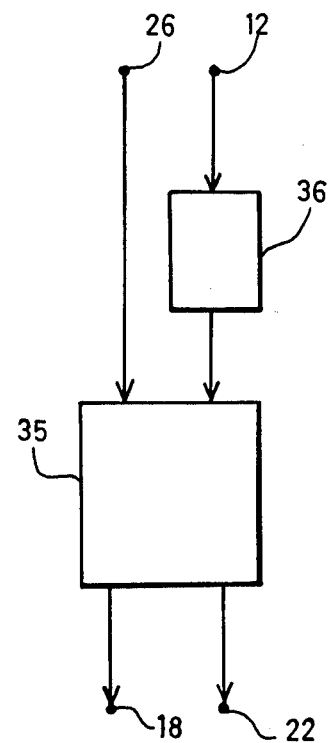
Fig. 5
Fig. 6

DIGITAL PHASE LOCKED LOOP USING FIXED FREQUENCY OSCILLATOR AND SIMULATED TIME-SHIFTING

The present invention relates to a phase changer for, upon generating an output signal with a frequency which is adjustable in relation to a basic frequency assigned an oscillator signal sent from an oscillator, coming into phase with a nominal frequency signal, said phase changer including a calculating unit for comparing the nominal frequency signal with the output signal and for calculating control signals in time stages, the output signal frequency being adjusted with the aid of such control signals. The output signal has come into phase with the nominal frequency signal if the frequency of the one signal is a whole number multiple of the frequency of the other. Timing pulse signals have come into phase if the calculating unit in combination with required whole number frequency conversions adjust the output signal frequency so that the phase difference between the signals is constant. However, the phase equalization does not need to go as far as exact phase equality, i.e. zero phase difference.

BACKGROUND ART

In the article "Phase-locked loop design fundamentals" with the Application Note AN-535 issued by Motorola Semiconductor Product Inc, voltage controlled VCXO crystal oscillators included in phase changing arrangements are described. These generate an output signal for synchronising different digital units. The known calculating unit includes an analog regulating filter and a charge pump controlled by a phase detector, and has its control signal output connected to the regulating voltage input on the oscillator. An analog controlled VCXO oscillator is about five times more expensive than an XO standard oscillator, which generates a signal of fixed frequency without any regulating capacity. The use of commercially available VCXO oscillators also brings with it as technical disadvantages that the generation of the analog regulating voltage obstructs digitalisation of the phase changing arrangement, and that the frequency adjustment range is limited.

DISCLOSURE OF INVENTION

A phase changer in accordance with the invention serves its purpose with the aid of a simple, non-regulatable XO crystal oscillator, the basic frequency signal of which is fed to a digital delay circuit generating an output signal of adjustable frequency. The delay circuit achieves delays which time is changing linear on the average. Positive or negative degrees of delay change result in frequency reductions or frequency increases. THe greater the change degree variation, the greater the frequency adjustment range. The proposed phase changer includes a digital calculating unit which compares the nominal frequency signal with the output signal of the delay circuit. When the comparison relates that there is a frequency difference, the calculating unit regulates the degree of change in the delay circuit so that the output signal comes into phase with the nominal frequency signal.

According to a first embodiment of the phase changer, the degree of change in the delay circuit is varied stepwise between two change degree boundaries associated with two output signal boundary frequencies. The task of the calculating unit is to calculate digitally in time stages and to order the relevant degree of change for adjusting the output signal to the nominal frequency signal. According to a second embodiment, the delay circuit operates either with a positive change degree boundary or with an equal negative change degree boundary or with a change degree equal to zero, so that the circuit generates an output signal either with a lower boundary frequency or with an upper boundary frequency or with the oscillator basic frequency intermediate between the boundary frequencies. The calculating unit in accordance with the second embodiment determines which os said three degrees of change shall be used, and for what length of time, to obtain an output signal having a mean frequency resulting in an acceptable phase adjustment to the nominal frequency signal. Both embodiments enable, in a digital way, phase equalization of the output signal in relation to a whole number multiple of the nominal frequency, which is not lower than the lower, and not higher than the upper boundary frequency.

The characterizing features of the invention are disclosed in the claim.

BRIEF DESCRIPTION OF DRAWINGS

The invention will now be described in detail with reference to the accompanying drawing, on which FIGS. 1 and 2, respectively, illustrate as a matter of principle and with the aid of time charts, respectively, how delays changing linearly with time are achieved and used for frequency adjustment.

BEST MODE FOR CARRYING OUT THE INVENTION

Figures 1, 4:
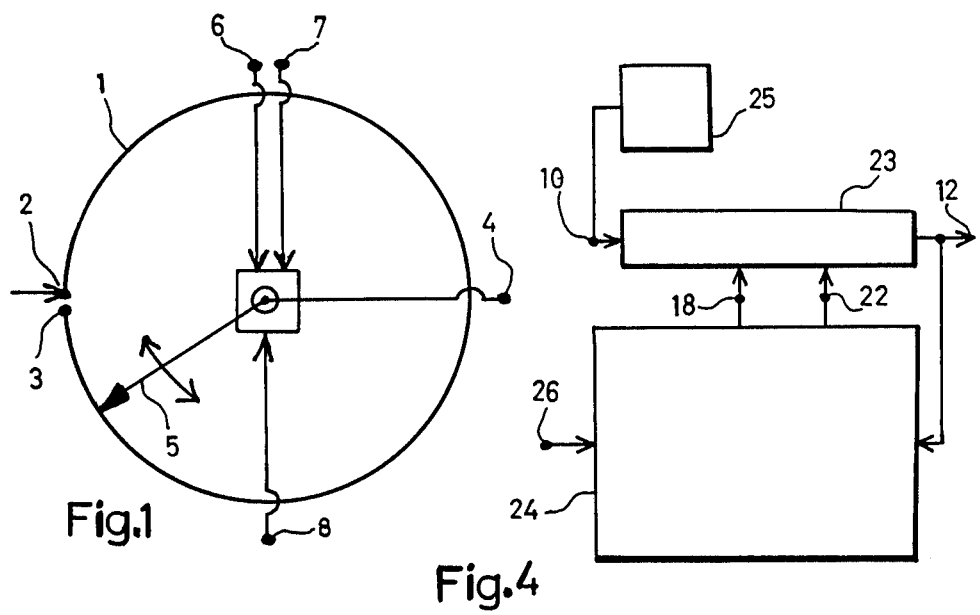

FIG. 1 is a symbolic depiction of a circuit for providing delays $\Delta$ which change linearly with the time t, $\Delta = C \times t$. A circular but open delay line 1 is fed via one end contact 2 with a basic frequency signal. Between both end contacts 2 and 3 of the line there is a signal delay which is equal to one period of the basic frequency $f_0$, $\Delta_{2-3} = 1/f_0$. The circuit output 4 is connected to the line via a sliding contact 5 rotating with a variable angular velocity. The sliding contact rotation is controlled with the aid of control signals received on circuit control inputs 6-8. The direction of rotation is clockwise or anticlockwise, respectively, in response to activation of the control input 6 or the control input 7, respectively. The signal received via the control input 8 determines the angular velocity $d_\Delta/d_t = C$. By means of a signal code for the angular velocity, for example "1:1000", i.e. $C = 10^{-3}$, it is expressed that the delay changes a basic frequency period during one thousand basic frequency periods.

FIG. 2a depicts a basic frequency timing signal with 0.5 $\mu$s period lenghts, i.e. 2 MHz basic frequency, which is a standardized PCM (Pulse Code Modulation) bit timing frequency. FIG. 2b depicts a delay time chart for a clockwise angular velocity "1:10", and it is assumed that the sliding contact 5 glides over the end contacts 2 and 3 at the time $t_0$. FIG. 2c depicts the output signal sent from the circuit output 4 generated with the clockwise angular velocity "1:10". Due to the linearly increasing delay according to FIG. 2b, 9 output signal periods are sent under 5 μs, i.e. the outgoing timing frequency is 1.8 MHz.

FIGS. 2d and 2e depict a delay time chart for an anti-clockwise angular velocity "1:20" and the associated output signal. Due to the linearly decreasing delay according to FIG. 2d, 10.5 output signal periods are sent during 5 μs, i.e. the outgoing timing frequency is 2.1 MHz. With the aid of dashed lines it is illustrated in FIG. 2, how output signal amplitudes are formed at some points in time due to the delay times then relevant.

Figure 3:
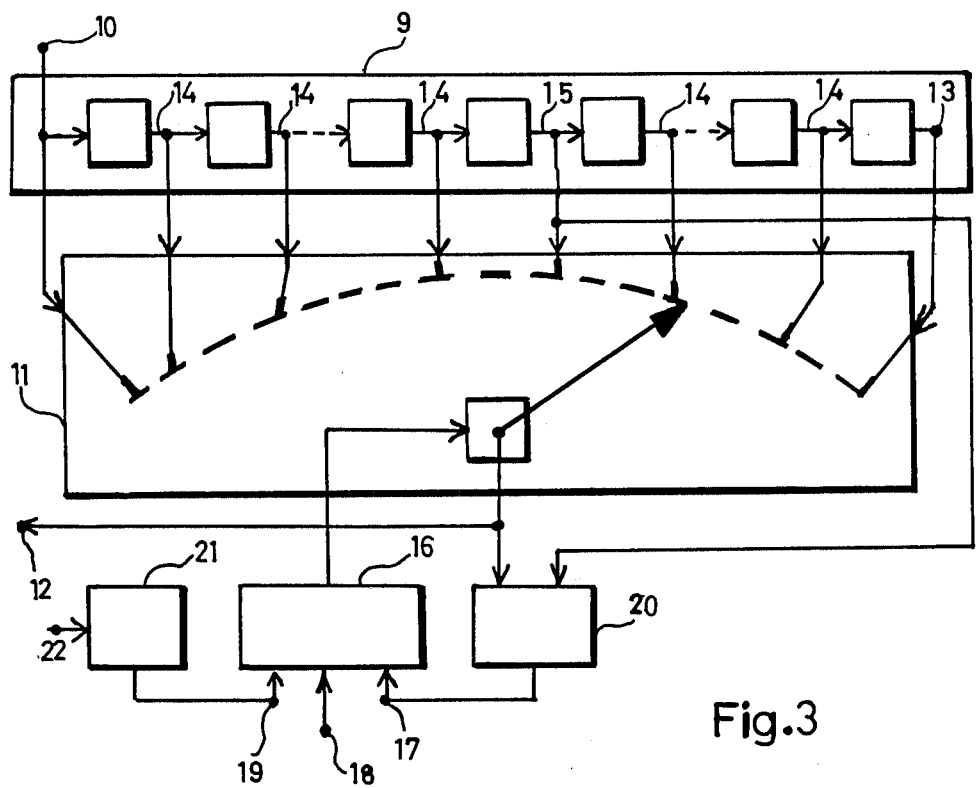
FIG. 3 illustrates a technically practical solution for providing such delays, being used in a phase changer according to FIG. 4, which includes a calculating unit, one embodiment of the calculating unit being illustrated in FIG. 5 and another in FIG. 6.

FIG. 3 illustrates a practically utilisable delay circuit design, the delay line of which comprises a large number of series-connected logical delay elements 9. The input 10 of the element chain receives a basic frequency timing signal. If each element causes such as $D \approx 1$ ns delay, due to its reaction time, about 500 elements are required to provide a delay line adapted as above for $f_0 \approx 2$ MHz basic frequency. Since it is difficult in practice to realise a delay to an acceptable extent equal to a period of a basic frequency which is not entirely stable either, the delay chain illustrated in FIG. 3 includes sufficient elements for the chain delay to be at least 2 basic frequency periods.

The above-mentioned sliding contact 5 of FIG. 2 is implemented with the aid of a selector 11, the output 12 of which constitutes the output of the delay circuit, and which has each of its inputs connected to a chain end 10,13 or chain link 14,15. The selector is controlled with the aid of a counter 16, e.g. a Motorola Modular-N counter MC 54416, which is provided with a setting input 17, a count direction input 18 and a stepping input 19.

On activation of the setting input 17 the counter is set to a number by which the selector is set to one of the chain links, hereinafter called setting link 15. The setting link 15 is chosen within the delay chain such that signal delays are obtained from the ends 10 and 13 of the chain which differ by at least one basic frequency period from the delay obtained from the setting link. The counter setting input 17 is connected to the output of a setting phase detector 20, the comparison inputs of which are connected to the setting link 15 and the selector output 12. The conventional setting phase detector, e.g. a Motorola Phase Frequency Detector MC 12040, sends an activation signal when the output signal has come into phase with the signal received from the setting link. The circular delay line described in FIG. 1 is realised by means of arranging an at least two-period delay chain 9, a selector 11, a counter 16 and a setting phase detector 20, as shown in FIG. 3, without having to put severe demands on the stability of the basic frequency $f_0$ and the reaction time D of the delay elements.

The selector is set to successive selector inputs with the aid of successive counter number settings. Due to the logical state of the counter direction input 18, the counter counts upwards or downwards, respectively, corresponding to the above-mentioned clockwise or anti-clockwise, respectively, direction of rotation. Delays are achieved which time is changing linear on the average.

The stepping input 19 of the counter is connected to a step timing generator 21, provided with a control input 22. The counter number setting changes one number unit for each step timing pulse. The product of the reaction time D and the stepping frequency $f_s$ corresponds to the angular velocity C described above. There is thus obtained that the incoming signal is adjusted, independent of its frequency $f_0$, by the use of delay elements, the reaction time of which is 1 ns, with 1 ppm = $1 \times 10^{-6}$ each time the stepping frequency $f_s$ is changed 1 kHz.

A phase changer is illustrated in FIG. 4, where a delay circuit 23 according to FIG. 3 is used, and in this circuit the counter direction input 18 and step timing control input 22 are connected to a digital calculating unit 24. The delay circuit receives a basic frequency signal on its input 10, generated by a simple non-regulatable XO standard oscillator 25. The delay circuit output 12 constitutes the output of the phase changer. The calculating unit, FIGS. 5 and 6 each illustrating an embodiment thereof, compares a nominal frequency signal received on the input 26 of the phase changer, with the output signal sent from the output 12 of the phase changer, and generates in response to the relevant comparison result a count direction signal and step timing control information.

The calculating unit of FIG. 5 includes a first frequency counter 27, which receives the output signal from the phase changer input 12 and also includes a frequency multiplier 28, which receives the nominal frequency signal from the phase changer input 26. The multiplier is needed if the oscillator frequency is to be adjusted to a whole number N times the nominal frequency. In a PCM standard system there is generated, for example, the $2^{11}$ kHz bit timing signal with the aid of a $2^3$ kHz synchronizing nominal signal, i.e. the multiplier 28 performs a frequency multiplication with a constant factor $N = 2^8 = 256$. For the case where N=1 the multiplier is excluded. The multiplier, in case it is needed, has its output connected to a second frequency counter 29.

The frequency counters 27 and 29 have their control inputs for zero setting and start connected to a delay means 30, the input of which is activated each time the second counter 29 sends a cycle termination signal. For a too high or too low, respectively, frequency of the output signal in relation to the nominal signal, the first counter has already started a new cycle or has not had time to terminate its cycle, respectively, when the second coutner sends a cycle termination signal, with the aid of which the counters are stopped. In the use of such as conventional digital $2^{20}$ counters ($2^{20} \approx 10^6$) there is obtained information from the first counter 27 as to how many ppm by which the output signal must be adjusted. The delay means 30 is arranged to start the counters 27 and 29 in suitable time stages. The least significant bit positions of the first counter, these containing the frequency adjusting information, are connected to a memory means with a table function 31, which is activated by the cycle termination signal. The memory means stores information as to step frequency changes which achieve in the delay circuit 23 the necessary step frequency adjustments and count direction changes.

The step frequency change associated with the relevant adjusting information is sent from the memory means 31 to the first input of an arithmetic unit 32, the outputs and second inputs of which are respectively connected to inputs and outputs of a step frequency register 33 for storing information as to the instant count direction and the instant step frequency, the magnitude of which is transferred as a step timing control signal to the control input 22 of the step timing generator 21.

For a too high or too low, respectively, frequency of the output signal in relation to the nominal signal, the instant step frequency registered in the step frequency register shall be increased or decreased, respectively, by the step frequency change obtained from the memory means. If the change results in an output signal frequency which is lower or higher, respectively, than the oscillator frequency, a positive or negative, respectively, stepping frequency value is obtained. Due to a positive or negative, respectively, prefix sign determined by the arithmetic unit 32, a prefix sign bit position 34 in the stepping frequency register assumes a logical "ONE" or a logical "ZERO" state, respectively, the prefix sign bit position being connected to the count direction input 18 of the delay circuit.

A phase changer which includes a calculating unit according to FIG. 5 achieves an exact frequency adjustment, whereby the output signal boundry frequencies only depend on the practically possible maximum stepping of the delay circuit counter 16 and selector 11.

The calculating unit depicted in FIG. 6 includes a nominal phase detector 35, one comparison input of which receives the nominal frequency signal from the phase changer input 26, and the other comparison input of which is connected to the phase changer output 12 via a frequency divider 36, for dividing the output signal frequency by a constant whole number N if the oscillator frequency is to be adjusted to N times the nominal frequency. For the case where N=1 the frequency divider is excluded. Due to phase differences varying with time in the signals received in time stages, i.e. due to an output signal which must have its phase corrected, the conventional digital nominal phase detector 35, e.g. a Motorola Phase Frequency Detector MC 12040, sends relevant logical states as count direction signals to the count direction input 18 of the delay circuit and as step timing control signals to the step timing generator control input 22.

The step timing generator 21 is either inactive i.e. the output signal frequency is set to the oscillator frequency, or it sends a step timing signal, the constant frequency of which determines the frequency adjusting range of the phase changer. In using the delay elements 9, with a reaction time D=1 ns, there is obtained according the above, with the aid of $f_s=1$ MHz constant step timing frequency, an adjusting range which is 1/00 of the oscillator frequency. The nominal phase detector 35 determines which of the three possible frequencies, i.e. the oscillator frequency and the two adjusting boundary frequencies, is to be send for how long to obtain an output signal with a men frequency resulting in an acceptable phase adjustment to the nominal frequency signal.

In a phase changer including a calculating unit according to FIG. 6, the adjusting range depends on the practically possible maximum delay change degree, and on the acceptable instant phase difference between the nominal frequency signal and the output signal. In return, the design according to FIG. 6 is much simpler than the one according to FIG. 5.

I claim:

1. A phase changer comprising:
    a delay circuit including a time-varying input having a frequency, a time-varying output having a frequency, and a control terminal, said output being identical to said input except time-shifted by a varying amount substantially proportional to an elapsed time relative to a recurring cycle time;
    a fixed frequency oscillator providing said input; and
    a digital calculating unit receiving said output and a nominal frequency signal, comparing in phase said output and said nominal frequency signals, and outputting to said control terminal, at successive time stages, control signals indicating a signed constant by which said varying amount is substantially proportional to said elapsed time, said constant being of one sign resulting in the frequency of said output being lower than the frequency of said input and said constant being of the other sign resulting in the frequency of said output being higher than the frequency of said input, said calculating unit producing said control signals such that said output is brought into phase with said nominal frequency signal.

2. The phase changer of claim 1 in which said delay circuit comprises:
    a digital delay line connected to said input and having a plurality of taps, adjacent taps producing delayed signals time-displaced from one another by an elemental delay time;
    a multiplexor receiving and selecting from among said delayed signals to provide said output; and
    a counter circuit controlling said multiplexor.

3. The phase changer of claim 2 in which said counting circuit comprises:
    a modulo-N counter receiving a sign bit portion of said signed constant; and
    a step-timing generator receiving the remainder of said signed constant besides said sign bit and generating a series of stepping signals, each changing a count of said counter by one.

4. The phase changer of claim 3 in which said counting circuit further comprises a phase coincidence detector receiving said output and a particular delayed signal and producing a coincidence signal on a setting input of said counter, said particular delayed signal being chosen such that its delay differs from the delays of both a delayed signal produced at a first said tap and a delayed signal produced at a last said tap by at least one period corresponding to the frequency of said input.

5. The phase changer of claim 1 in which said calculating unit comprises:
    a frequency multiplier receiving said nominal frequency signal and producing a frequency-multiplied signal;
    a frequency counting circuit receiving said output and said frequency-multiplied signal and producing a frequency adjusting signal and a cycle termination signal;
    a lookup table receiving said frequency adjusting and cycle termination signals and producing a step frequency change signal; and
    an arithmetic circuit receiving said step frequency signal together with said signed constant from a terminated cycle and producing a new signed constant.

6. The phase changer of claim 1 in which said calculation unit comprises:
    a frequency divider receiving said output and producing a frequency-divided signal; and
    a nominal phase detector receiving said nominal frequency signal together with said frequency-divided signal and producing said signed constant.

* * * * *